(12) United States Patent
Hyot et al.

(10) Patent No.: US 9,698,011 B2
(45) Date of Patent: Jul. 4, 2017

(54) PROCESS FOR GROWING AT LEAST ONE NANOWIRE USING A TRANSITION METAL NITRIDE LAYER OBTAINED IN TWO STEPS

(71) Applicant: Commissariat a L'energie Atomique et aux Energies Alternatives, Paris (FR)

(72) Inventors: Berangere Hyot, Eybens (FR); Benoit Amstatt, Grenoble (FR); Marie-Francoise Armand, Vaulnaveys-le-Haut (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 14/064,916

(22) Filed: Oct. 28, 2013

(65) Prior Publication Data

US 2014/0120637 A1    May 1, 2014

Related U.S. Application Data

(60) Provisional application No. 61/728,019, filed on Nov. 19, 2012.

(30) Foreign Application Priority Data

Oct. 26, 2012  (FR) ..................... 12 60208

(51) Int. Cl.
*H01L 21/00*      (2006.01)
*H01L 21/02*      (2006.01)
(Continued)

(52) U.S. Cl.
CPC ...... *H01L 21/02609* (2013.01); *C30B 25/005* (2013.01); *C30B 25/183* (2013.01);
(Continued)

(58) Field of Classification Search
CPC .................................. H01L 21/02603
(Continued)

(56) References Cited

U.S. PATENT DOCUMENTS 5,254,499 A    10/1993  Sandhu et al.
5,580,823 A *  12/1996  Hegde et al. ............ 438/648
(Continued)

FOREIGN PATENT DOCUMENTS

DE  10 2010 012711 A1    9/2011
EP       1 246 233 A     10/2002
(Continued)

OTHER PUBLICATIONS

Sang et al., Structural and stimulated emission characteristics of diameter-controlled ZnO nanowires using buffer structure, J. Phys. D: Appl. Phys. 42 (2009) 225403 (6pp), Oct. 29, 2009.*
(Continued)

*Primary Examiner* — Igwe U Anya
(74) *Attorney, Agent, or Firm* — Westerman, Hattori, Daniels & Adrian, LLP

(57) ABSTRACT

The process for growing at least one semiconductor nanowire (3), said growth process comprising a step of forming, on a substrate (1), a nucleation layer (2) for the growth of the nanowire (3) and a step of growth of the nanowire (3). The step of formation of the nucleation layer (2) comprises the following steps: deposition onto the substrate (1) of a layer of a transition metal (4) chosen from Ti, V, Cr, Zr, Nb, Mo, Hf, Ta; nitridation of at least a part (2) of the transition metal layer so as to form a transition metal nitride layer having a surface intended for growing the nanowire (3).

20 Claims, 4 Drawing Sheets

Figure 1:
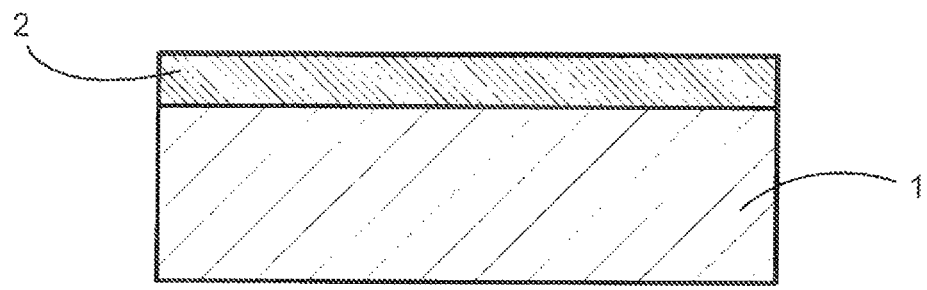

(51) Int. Cl.

| | |
|---|---|
| *H01L 21/66* | (2006.01) |
| *H01L 33/06* | (2010.01) |
| *C30B 25/00* | (2006.01) |
| *C30B 25/18* | (2006.01) |
| *C30B 29/16* | (2006.01) |
| *C30B 29/36* | (2006.01) |
| *C30B 29/40* | (2006.01) |
| *C30B 29/60* | (2006.01) |
| *H01L 33/00* | (2010.01) |
| *B82Y 20/00* | (2011.01) |
| *H01L 33/16* | (2010.01) |
| *B82Y 40/00* | (2011.01) |

(52) U.S. Cl.
CPC .............. *C30B 29/16* (2013.01); *C30B 29/36* (2013.01); *C30B 29/403* (2013.01); *C30B 29/605* (2013.01); *H01L 21/0254* (2013.01); *H01L 21/02491* (2013.01); *H01L 21/02516* (2013.01); *H01L 21/02603* (2013.01); *H01L 21/02614* (2013.01); *H01L 21/02639* (2013.01); *H01L 21/02658* (2013.01); *H01L 22/12* (2013.01); *H01L 33/007* (2013.01); *H01L 33/06* (2013.01); *B82Y 20/00* (2013.01); *B82Y 40/00* (2013.01); *H01L 21/02653* (2013.01); *H01L 33/16* (2013.01); *H01L 2924/0002* (2013.01)

(58) Field of Classification Search
USPC .......................................................... 438/16
See application file for complete search history.

(56) References Cited

U.S. PATENT DOCUMENTS

| | | | |
|---|---|---|---|
| 5,593,511 | A | 1/1997 | Foster et al. |
| 6,093,645 | A | 7/2000 | Ameen et al. |
| 6,297,063 | B1 | 10/2001 | Brown et al. |
| 6,617,060 | B2 | 9/2003 | Weeks, Jr. et al. |
| 6,818,061 | B2 | 11/2004 | Peczalski et al. |
| 7,335,908 | B2 | 2/2008 | Samuelson et al. |
| 7,365,374 | B2 | 4/2008 | Piner et al. |
| 7,682,943 | B2 | 3/2010 | Samuelson et al. |
| 7,745,813 | B2 | 6/2010 | Samuelson et al. |
| 7,791,106 | B2 | 9/2010 | Piner et al. |
| 7,829,443 | B2 | 11/2010 | Seifert et al. |
| 8,049,203 | B2 | 11/2011 | Samuelson et al. |
| 8,105,921 | B2 | 1/2012 | Weeks, Jr. et al. |
| 8,450,717 | B1 | 5/2013 | Samuelson et al. |
| 8,772,626 | B2 | 7/2014 | Samuelson et al. |
| 8,928,034 | B2 | 1/2015 | Weeks, Jr. et al. |
| 8,928,035 | B2 | 1/2015 | Weeks, Jr. et al. |
| 8,937,335 | B2 | 1/2015 | Weeks, Jr. et al. |
| 8,986,835 | B2 | 3/2015 | Wildeson et al. |
| 2001/0001954 | A1 | 5/2001 | Urabe |
| 2002/0078881 | A1 | 6/2002 | Cuomo et al. |
| 2002/0086534 | A1 | 7/2002 | Cuomo et al. |
| 2002/0117677 | A1 | 8/2002 | Okuyama et al. |
| 2002/0197825 | A1 | 12/2002 | Usui et al. |
| 2003/0102444 | A1 | 6/2003 | Deppert et al. |
| 2004/0004242 | A1 | 1/2004 | Yamamoto |
| 2004/0074364 | A1 | 4/2004 | Prudhomme |
| 2004/0132315 | A1 | 7/2004 | Chambers et al. |
| 2005/0006673 | A1 | 1/2005 | Samuelson et al. |
| 2005/0233093 | A1 | 10/2005 | Tada et al. |
| 2006/0048866 | A1* | 3/2006 | Takada ................... C23C 26/00 148/423 |
| 2006/0270200 | A1* | 11/2006 | Shibata ......................... 438/481 |
| 2007/0248132 | A1 | 10/2007 | Kikuchi et al. |
| 2008/0017278 | A1* | 1/2008 | Nagae ................... C22C 1/1078 148/207 |
| 2008/0036038 | A1* | 2/2008 | Hersee et al. ................. 257/615 |
| 2008/0057344 | A1 | 3/2008 | Murakami et al. |
| 2008/0105296 | A1 | 5/2008 | Samuelson et al. |
| 2008/0142784 | A1 | 6/2008 | Samuelson et al. |
| 2008/0149914 | A1 | 6/2008 | Samuelson et al. |
| 2008/0149944 | A1 | 6/2008 | Samuelson et al. |
| 2008/0188064 | A1 | 8/2008 | Samuelson et al. |
| 2008/0233692 | A1 | 9/2008 | Yu et al. |
| 2008/0261378 | A1 | 10/2008 | Yao et al. |
| 2009/0098343 | A1* | 4/2009 | Arena et al. ................... 428/172 |
| 2010/0096614 | A1 | 4/2010 | Kim et al. |
| 2010/0124025 | A1 | 5/2010 | Yamaguchi et al. |
| 2010/0276664 | A1* | 11/2010 | Hersee ............................ 257/15 |
| 2011/0062453 | A1 | 3/2011 | Armitage |
| 2011/0079766 | A1 | 4/2011 | Wildeson et al. |
| 2011/0127490 | A1* | 6/2011 | Mi ................... 257/13 |
| 2011/0133160 | A1* | 6/2011 | Yu et al. ......................... 257/14 |
| 2011/0140072 | A1 | 6/2011 | Varangis et al. |
| 2012/0001303 | A1 | 1/2012 | Huang et al. |
| 2012/0045903 | A1 | 2/2012 | Harada et al. |
| 2012/0068153 | A1 | 3/2012 | Seong et al. |
| 2012/0205613 | A1* | 8/2012 | Mi et al. ........................... 257/9 |
| 2012/0313078 | A1* | 12/2012 | Fukui et al. ..................... 257/14 |
| 2013/0127099 | A1* | 5/2013 | Mimura .................. C22C 38/02 267/166 |
| 2013/0146835 | A1 | 6/2013 | Samuelson et al. |
| 2013/0207075 | A1* | 8/2013 | Myers et al. ................... 257/13 |
| 2013/0221322 | A1 | 8/2013 | Ohlsson |
| 2014/0080290 | A1 | 3/2014 | Eymery et al. |
| 2014/0117308 | A1 | 5/2014 | Hyot et al. |
| 2015/0027523 | A1 | 1/2015 | Samuelson et al. |
| 2015/0279672 | A1 | 10/2015 | Hyot et al. |
| 2015/0280053 | A1 | 10/2015 | Gilet et al. |
| 2015/0295041 | A1 | 10/2015 | Hyot et al. |

FOREIGN PATENT DOCUMENTS

| | | |
|---|---|---|
| EP | 1 796 180 A | 6/2007 |
| EP | 2284868 A1 | 2/2011 |
| EP | 2290710 A1 | 3/2011 |
| WO | 02/44444 A1 | 6/2002 |
| WO | WO 02/44444 A | 6/2002 |
| WO | 2004004927 A2 | 1/2004 |
| WO | 2007102781 A1 | 9/2007 |
| WO | 2008085129 A1 | 7/2008 |
| WO | 2009072631 A1 | 6/2009 |
| WO | 2010/022064 A1 | 2/2010 |
| WO | WO 2010/022064 A | 2/2010 |
| WO | 2011/162715 A9 | 12/2011 |
| WO | WO 2011/162715 A | 12/2011 |
| WO | WO 2011162715 A1 * | 12/2011 |
| WO | WO 2012043885 A1 * | 4/2012 |
| WO | 2012136665 A1 | 10/2012 |

OTHER PUBLICATIONS

Search Report issued by French Patent Office for priority French application 1260208 dated Jul. 10, 2013.
International Search Report dated Jun. 5, 2014 issued in corresponding application No. PCT/EP2013/072424, now U.S. Appl. No. 14/438,480.
French Search Report dated Jul. 10, 2013 issued in corresponding application No. FR1260208; with English partial translation and partial machine translation.
International Search Report dated Jun. 2, 2014 issued in co-pending application No. PCT/EP2013/072426, now U.S. Appl. No. 14/438,497.
French Search Report dated Jul. 30, 2013 issued in application No. FR1260209 corresponding to co-pending application No. PCT/EP2013/072426, now U.S Appl. No. 14/438,497; with English translation.
Oliver et al., "Organometallic vapor phase epitaxial growth of GaN on ZrN/AlN/Si substrates", Applied Physics Letters, vol. 93, 023109, 2008; cited in the French Search Report of FR1260209 corresponding to co-pending PCT/EP2013/072426, now U.S. Appl. No. 14/438,497 (in English, 3 pages).
Search Report issued by STIC Database Tracking No. 483674— "Re: Process for Growing at Least One Nanowire Using a Transition

(56) References Cited

OTHER PUBLICATIONS

Metal Nitride Layer Obtained in Two Steps", dated Apr. 27, 2015; in co-pending U.S. Appl. No. 14/064,858 (in English, 8 pages).
Liu et al.. "InN nanorods prepared with CrN nanoislands by plasma-assisted molecular beam epitaxy", Nanoscale Research Letters, 2011, pp. 1-6; in co-pending U.S. Appl. No. 14/064,858.
Liu et al., "Growth of InN nanorods prepared by plasma-assisted molecular beam epitaxy with varying Cr thicknesses", Journal of Crystal Growth, vol. 347, 2012, pp. 113-118; in co-pending U.S. Appl. No. 14/064,858.
Office Action dated Nov. 30, 2015 issued in co-pending U.S. Appl. No. 14/064,858 (9 pages).
Office Action dated Nov. 9, 2015 issued in co-pending U.S. Appl. No. 14/438,497 (6 pages).
Liu, Kuang-Wei et al.: "InN nanorods prepared with CrN nanoislands by plasma-assisted molecular beam epitaxy", *Nanoscale Research Letters,* 2011, 6:442, pp. 1 of 6 to 6 of 6.
Liu, K.W. et al.: "Growth of InN nanorods prepared by plasma-assisted molecular beam epitaxy with varying Cr thicknesses", *Journal of Crystal Growth,* 347 (2012) pp. 113-118.
Oliver, Mark H. et al.: "Organometallic vapor phase epitaxial growth of GaN on ZrN/AlN/Si substrates", *Applied Physics Letters,* 93, (2008), pp. 023109-1 to 023109-3.
Search Report prepared by Scientific and Technical Information Center (STIC) for U.S. Appl. No. 14/064,916 dated Apr. 27, 2015.
Office Action dated Jul. 29, 2016 issued in co-pending U.S. Appl. No. 14/064,858 (without SB08, 8 pages) (US20130221322 to Ohlsson and US20100124025 to Yamaguchi et al. cited in the Office Action are not listed in this IDS since they were listed in a previous IDS filed on Mar. 29, 2016).
Office Action dated Aug. 4, 2016 issued in co-pending U.S. Appl. No. 14/438,497 (without SB08, 9 pages) (US20100096614A1 to Kim et al. cited in the Office Action is not listed in this IDS since it was listed in a previous IDS filed on Mar. 3, 2016).
International Search Report and Written Opinion dated Jan. 17, 2014 in counterpart PCT Application No. PCT/EP2013/072448 of co-pending U.S. Appl. No. 14/438,188 (in English; ISR in co-pending U.S. Appl. No. 14/438,188; 17 pages).
International Preliminary Report on Patentability dated Apr. 28, 2015 in counterpart PCT Application No. PCT/EP2013/072448 of co-pending U.S. Appl. No. 14/438,188 (in English; ISR in co-pending U.S. Appl. No. 14/438,188; 13 pages).
Chen, X. et al., "Homoepitaxial growth of catalyst-free GaN wires on N-polar substrates", Applied Physics Letters, AIP, American Institute of Physics, Melville, NY, US, vol. 97, No. 15, Oct. 13, 2010 (in English; in co-pending U.S Appl. No. 14/438,188; 3 pages).
Song, K. et al., "Selective area growth of GaN nanowires using metalorganic chemical vapor deposition on nano-patterned Si (111) formed by the etching of nano-sized Au droplets", Thin Solid Films, 520(1 ), (2011) 126-130 (in English; in co-pending U.S Appl. No. 14/438,188).
Noborisaka, J. et al., "Catalyst-free growth of GaAs nanowires by selective-area metalorganic vapor-phase epitaxy", Applied Physics Letters 86 (2005), 213102 (in English; in co-pending U.S Appl. No. 14/438,188; 3 pages).
Office Action dated Mar. 30, 2016 issued in co-pending U.S Appl. No. 14/438,188 (with PTO892, without SB08, 9 pages).
Notice of Allowance dated Aug. 24, 2016 in co-pending U.S. Appl. No. 14/438,188 (7 pages).
International Written Opinion dated Jun. 5, 2014 issued in application No. PCT/EP2013/072424 corresponding to co-pending U.S. Appl. No. 14/438,480 (with English translation; 31 pages).
International Written Opinion dated Jun. 2, 2014 issued in application No. PCT/EP2013/072426 corresponding to co-pending U.S. Appl. No. 14/438,497 (with English translation; 33 pages).
Office Action dated Apr. 5, 2016 issued in co-pending U.S. Appl. No. 14/438,480 (with PTO892, without PTO1449, 27 pages).
Final Office Action dated Feb. 2, 2017 in co-pending U.S. Appl. No. 14/438,480 (without SB08, 38 pages).
Non-final Office Action dated Feb. 27, 2017 in co-pending U.S. Appl. No. 14/438,497 (without returned SB08, 11 pages).

\* cited by examiner

US 9,698,011 B2

PROCESS FOR GROWING AT LEAST ONE NANOWIRE USING A TRANSITION METAL NITRIDE LAYER OBTAINED IN TWO STEPS

This application claims priority benefits to French Patent Application 12/60208 filed Oct. 26, 2012 and claims priority benefits to U.S. Provisional Patent Application Ser. No. 61/728,019 filed Nov. 19, 2012, the disclosures of both are incorporated herein by reference.

TECHNICAL FIELD OF THE INVENTION

The invention relates to the field of semiconductor materials and more precisely that of the growth of semiconductor nanowires.

The invention relates more particularly to a process for growing at least one nanowire.

PRIOR ART

In the field of nanowire growth, it is known practice to use nucleation layers such as AlN (aluminum nitride) or TiN (titanium nitride). These layers may be deposited directly by LPCVD (low-pressure chemical vapor deposition) or by APCVD (atmospheric-pressure chemical vapor deposition) as described in document WO 2011/162715.

This document WO 2011/162715 states that semiconductor nanowires have a growth that may be promoted if the crystallographic orientation of a crystalline substrate enabling the growth is oriented in the direction [111] in a "face-centered cubic structure of NaCl type", or along the axis "c" in a "hexagonal" structure.

If the substrate is not correctly oriented, it is possible to deposit an AlN or TiN nucleation layer whose crystallographic structure will have a predominance of orientation in the direction [0001] for AlN which has a hexagonal structure and in the direction [111] for TiN which has a face-centred cubic structure (fcc) structure.

It results from the foregoing that the crystallographic orientation of the growth support for nanowires is important. The predominance in a correct direction of a crystallographic structure should thus be optimized in order to promote the growth of the nanowires from this crystallographic structure.

OBJECT OF THE INVENTION

The aim of the present invention is to propose a solution for improving the crystallographic orientation of a nucleation layer of one or more nanowires.

Steps toward this aim are taken by a process for growing at least one semiconductor nanowire, said growth process comprising a step of forming, on a substrate, a nucleation layer for the growth of the nanowire and a step of growth of the nanowire, in particular the step of forming the nucleation layer comprises the following steps: deposition on the substrate of a layer of a transition metal chosen from Ti, V, Cr, Zr, Nb, Mo, Hf, Ta; nitridation of at least part of the transition metal layer so as to form a layer of transition metal nitride having a surface intended for the growth of the nanowire.

Advantageously, the nitridation step of said transition metal layer is performed so as to at least partly modify the crystallographic structure of the transition metal layer toward a face-centered cubic crystallographic structure, which is especially oriented [111], or hexagonal, which is especially oriented [0001] or along the direction of the axis "C", associated with the transition metal nitride layer.

According to a particular implementation, the nitridation step comprises: a first nitridation substep at least partly performed at a first temperature by imposing an injection of a nitridation gas at a first flow rate; a second nitridation substep at least partly performed at a second temperature less than or equal to the first temperature by imposing an injection of the nitridation gas at a second flow rate different from the first flow rate. For example, the injected nitridation gas is ammonia, and: the first temperature is between 1000° C. and 1050° C., especially equal to 1050° C.; the first flow rate is between 500*V/8 sccm and 2500*V/8 sccm, especially equal to 1600*V/8 sccm; the second temperature is between 950° C. and 1050° C., especially equal to 1000° C.; the second flow rate is between 500*V/8 sccm and 2500*V/8 sccm, especially equal to 480*V/8 sccm; and in which V is the total capacity in liters of a corresponding nitridation chamber.

According to one implementation, the nitridation step is performed in a nitridation chamber placed at a pressure of between 50 mbar and 800 mbar, especially 100 mbar.

As an example, the nanowire growth step is performed after the second nitridation substep, or is initiated during the second nitridation substep.

Preferably, the nanowire growth step comprises a step of injecting Ga so as to form the gallium nitride nanowire, said nanowire extending from the growth surface of the nucleation layer.

Advantageously, with the substrate being silicon, the step of depositing the transition metal layer is configured such that the interdiffusion of silicon into the deposited transition metal layer is less than 10 nm and/or so as to conserve a non-siliciced slice of the transition metal layer of at least 2 nm.

In the case where the deposited transition metal is chosen from Cr, V or Ti, said transition metal is deposited at a temperature below 100° C.

Advantageously, the substrate being based on silicon, the step of depositing the transition metal layer comprises a preliminary step of determining the thickness of the transition metal layer to be deposited, comprising: a step of determining a first diffusion length of the silicon into the transition metal layer during the future deposition of the transition metal layer as a function of the transition metal used and of the deposition temperature; a step of determining a second diffusion length of the silicon into the transition metal layer during the future nitridation step of the transition metal layer; said thickness of the transition metal layer to be deposited being dependent on the desired thickness of the transition metal nitride layer and on a thickness of a slice of transition metal silicide obtained in the future transition metal layer from the first and second determined diffusion lengths.

According to one implementation of the growth process, said process comprises a step in which the substrate is envisioned such that it has a resistivity of between 1 mΩ·cm and 100 mΩ·cm.

Advantageously, the growth process comprises, before deposition of the transition metal layer, a step of deoxidation of a surface of the substrate intended to receive the transition metal layer.

The invention also relates to a process for manufacturing an optoelectronic device, said process comprising: a step of performing the growth process; the electrical doping of a first type of at least one end of the nanowire which is opposite the substrate; the formation of an electrically doped element of a second type opposite the first type at the end of the nanowire opposite the substrate. In addition, such a process may also comprise a step of forming quantum wells placed at the interface between the nanowire and the electrically doped element of the second type.

SUMMARY DESCRIPTION OF THE DRAWINGS

Figure 2:
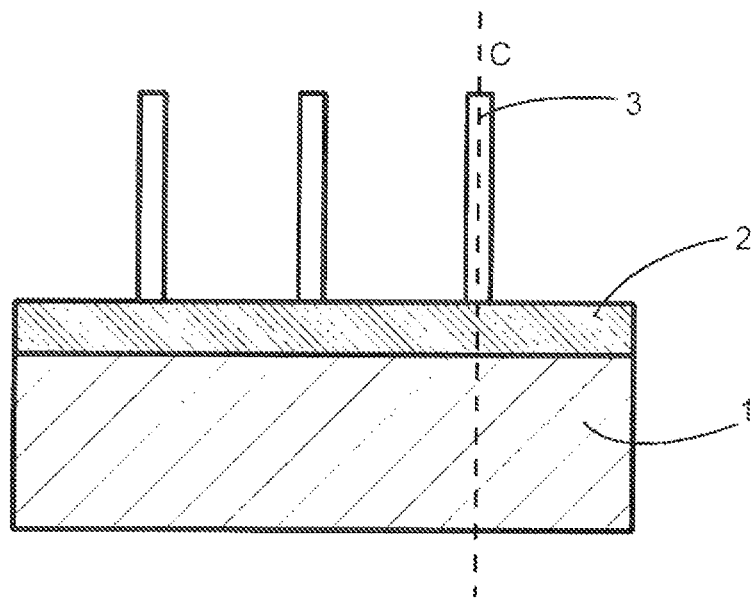
Figure 3:
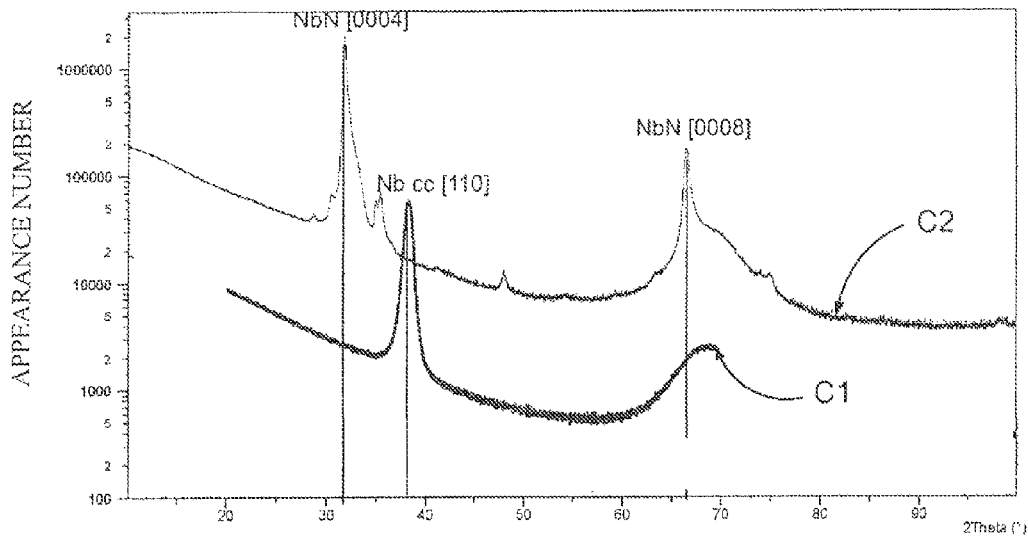
Figure 4:
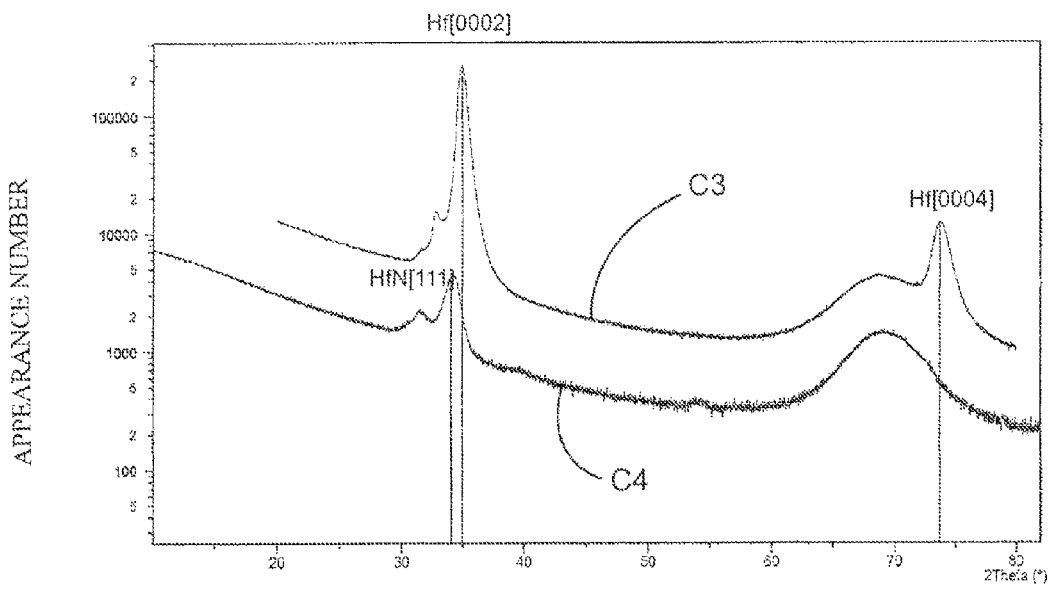
Figure 5:
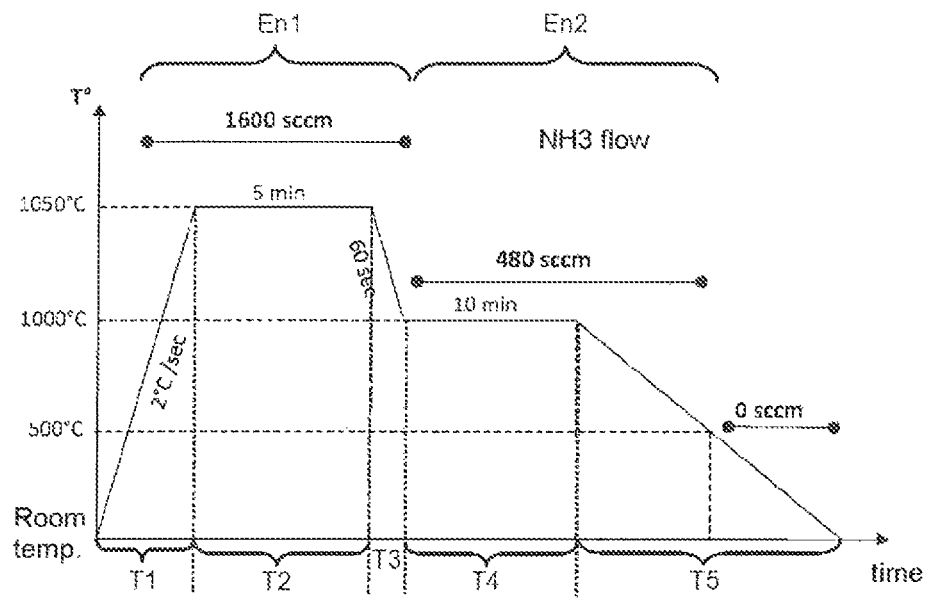
Figure 6:
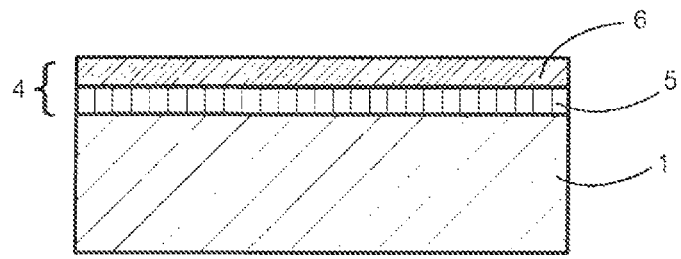
Figure 7:
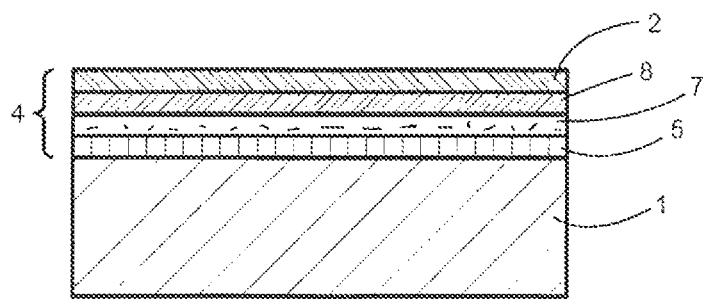
Figure 8:
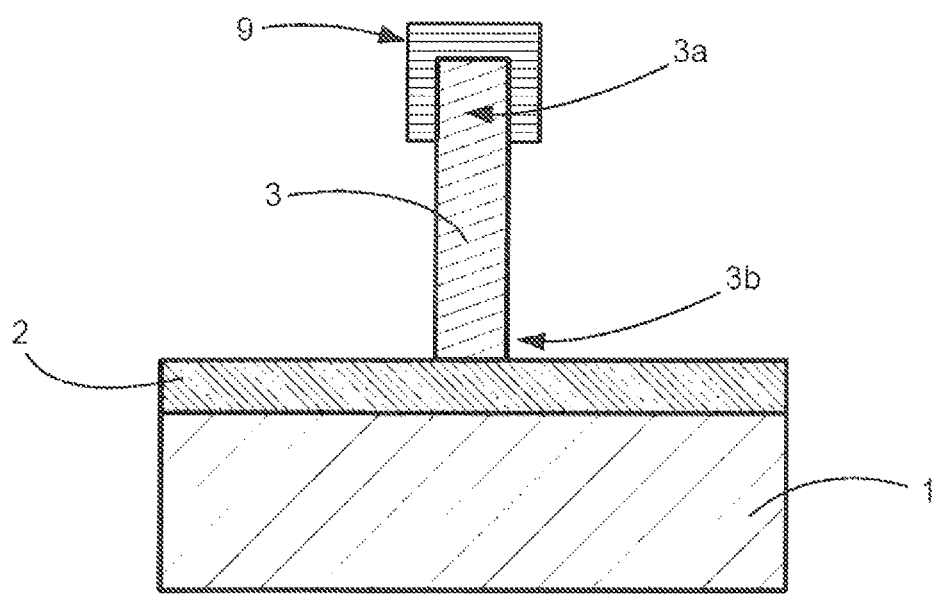

Other advantages and characteristics will emerge more clearly from the description which follows of particular embodiments of the invention, which are given as nonlimiting examples and represented on the attached drawings, in which:

FIG. 1 is a view in cross section of a step of formation of a nucleation layer,

FIG. 2 is a view in cross section of a step of nucleation of at least one nanowire from the nucleation layer, FIG. 3 illustrates a representation of the X-ray diffraction spectrum for identifying the types of crystallographic structures present in an Nb-based transition metal layer before nitridation and after nitridation, FIG. 4 illustrates a representation of the X-ray diffraction spectrum for identifying the types of crystallographic structures present in an Hf-based transition metal layer before nitridation and after nitridation, FIG. 5 represents in detail an implementation of a nitridation step according to one embodiment of the invention, FIGS. 6 and 7 illustrate different steps for preparing a nucleation layer, FIG. 8 illustrates a particular embodiment of a process for manufacturing an optoelectronic device.

DESCRIPTION OF PREFERENTIAL MODES OF THE INVENTION

The process described below differs from the prior art especially in that the nucleation layer is prepared in two steps, first deposition of a transition metal, followed by at least partial nitridation of this transition metal. This particular sequence of steps makes it possible to give the nucleation layer a better surface intended for growing the nanowires.

The term "microwire" or "nanowire" in the rest of the description preferentially means a three-dimensional structure of elongated shape whose longitudinal dimension is at least equal to once the transverse dimension(s), preferably at least five times and even more preferentially at least ten times. The transverse dimension(s) are between 5 nm and 2.5 μm. In certain embodiments, the transverse dimensions may be less than or equal to about 1 μm, preferably between 100 nm and 300 nm. In certain embodiments, the height of each nanowire may be greater than or equal to 500 nm, preferably between 1 μm and 50 μm.

As illustrated in FIG. 1, the process for growing at least one semiconductor nanowire comprises a step of forming, on a substrate 1, a nucleation layer 2 for the growth of the nanowire and a step of growth of the nanowire 3 (FIG. 2) from the nucleation layer. Needless to say, the step of growth of the nanowire 3 enables the latter to grow from the nucleation layer 2.

An example has been given based on the growth of a nanowire, but the growth process is not limited to this sole example and makes it possible, during the growth step, to grow a plurality of nanowires side by side from the nucleation layer 2.

It is understood from the foregoing that the prime function of the nucleation layer 2 is to promote the nucleation of the nanowire(s) 3. In addition, this nucleation layer 2 is preferably chosen so as to protect the substrate 1 from any degradation during the growth (which may be the case if the substrate is made of silicon and the nanowire made of gallium nitride), and/or to conserve good stability at high temperatures (in the case of temperatures above 500° C.), and/or to give good electrical conduction especially when it is desired to polarize each nanowire 3 and to inject current via the substrate 1.

As regards the substrate 1, the process may, in a nonlimiting manner, comprise a step in which the substrate is provided such that it has a resistivity of between 1 mΩ·cm and 100 mΩ·cm. This resistivity is advantageous when it is desired to polarize the nanowires as indicated above across the nucleation layer 2.

To begin with, it should be noted that a nucleation layer 2 makes it possible to promote the growth of one or more nanowires 3 when these wires grow from this nucleation layer 2 in the vast majority substantially perpendicular to the substrate 1 (axis C represented in FIG. 2). The term "substantially perpendicular to" means exactly perpendicular or perpendicular to more or less 10°. This slight disorientation of more or less 10° nevertheless permits the performance of subsequent technological steps for preparing more complete devices.

It will thus be sought to have, at the level of the nucleation layer, a crystallographic orientation adapted to the growth of the nanowires 3. Moreover, if this crystallographic orientation is dense, i.e. predominant, the density of these nanowires 3 can then be magnified.

For this, the step of formation of the nucleation layer comprises a step of deposition onto the substrate 1 of a layer of a transition metal 4 chosen from Ti (titanium), V (vanadium), Cr (chromium), Zr (zirconium), Nb (niobium), Mo (molybdenum), Hf (hafnium), Ta (tantalum), followed by a step of nitridation of at least part of the transition metal layer so as to form a layer of transition metal nitride (titanium nitride, vanadium nitride, chromium nitride, zirconium nitride, niobium nitride, molybdenum nitride, hafnium nitride or tantalum nitride, respectively, as a function of the initial transition metal layer deposited) having a surface intended for growing the nanowire(s) 3. In order to optimize the growth, this transition metal nitride layer may have a minimum thickness of 2 nm and preferably between 2 nm and 50 nm.

According to one implementation applicable to the different transition metals, especially for Hf, Nb and Ta, the deposited transition metal layer may have a thickness of between 20 nm and a few hundred nanometers (for example 200 nm). For the other transition metals, a thickness of 20 nm will be preferred. The deposition may be performed by PVD (physical vapor deposition) from a metal target, for example a continuous-current spray passing over the target. During this step of deposition of the transition metal, the substrate 1 may be maintained at room temperature. In a general manner applicable throughout the description, the term "room temperature" means a temperature preferably between 20° C. and 50° C. The pressure in the PVD chamber during the deposition of the transition metal may be between $3 \times 10^{-3}$ mbar and $6 \times 10^{-3}$ mbar.

After various tests, it was possible to observe that the growth of nanowire(s) was promoted by this nucleation layer 2 formed in two steps.

In point of fact, it turns out that the transition metal nitride layer thus formed has growth sites whose crystallographic orientation is more favorable to the growth of nanowires. These growth sites are in greater number and have a better distribution than in the prior art, especially by comparing a titanium nitride nucleation layer prepared according to the process of the invention relative to the titanium nitride layer deposited in a single step of the prior art.

Furthermore, the fact of choosing one of the following transition metals: Ti, V, Cr, Zr, Nb, Mo, Hf, Ta, to form, after nitridation of the said transition metal, the nucleation layer 2 makes it possible to combine electrical conduction characteristics of metallic type and the refractory nature of a ceramic. These properties, which are in principle antagonist, may be achieved by the transition metals mentioned above. In point of fact, the refractory nature may be achieved by a material whose melting point is associated with a temperature above about 1800° C., which is the case for the transition metal nitrides targeted above. Tungsten, although present in the same column as chromium and molybdenum, is set aside from the list since tungsten nitride has insufficient stability properties at high temperatures, which does not allow efficient growth of the nanowires.

The transition metal nitride layer thus obtained also makes it possible, by virtue of the transition metal used, to have a smaller gap than the AlN-based nucleation layers that have been very commonly used to date as nucleation layer. Thus, when the substrate 1 is based on silicon, the nucleation layer 2 according to the invention has at its interface with the substrate a potential barrier that is easier to cross than in the case where AlN is used, this giving an advantage when it is desired to polarize one or more nanowires from the substrate 1.

It results from the foregoing that the crystallographic orientation of the nucleation layer 2, especially on a surface intended for growing the nanowire(s), is of importance in the context of promoting the growth of nanowire(s). Thus, the step of deposition of the transition metal layer is preferentially performed such that said transition metal layer has, before the nitridation step, at least partly a crystallographic structure of centered cubic (CC) or of hexagonal (these two crystallographic structures are those of the metals mentioned above).

In the present description, when predominance of a crystallographic structure is mentioned, this means that said structure appears in greater proportion than each of the other crystallographic structures taken independently.

Typically, for the transition metals targeted above, the cubic-centered (CC) structure may be obtained naturally by depositing a layer of a transition metal chosen from Cr, Mo, V, Nb, Ta, and the hexagonal structure may be obtained naturally by depositing a layer of a transition metal chosen from Ti, Zr, Hf.

The specific crystallographic structures targeted previously make it possible to perform the step of nitridation of said transition metal layer or at least part of the transition metal layer so as to at least partly modify the crystallographic structure of the transition metal layer toward a face-centered cubic structure, which is especially oriented [111], or hexagonal, which is especially oriented [0001] or along the direction of the axis "C", associated with the transition metal nitride layer.

FIGS. 3 and 4 each illustrate an X-ray diffraction spectrum for identifying the crystallographic phases or structures present. FIG. 3 shows that for the curve C1 representing the crystallographic structure of the layer of transition metal of Nb type before nitridation, there is indeed a predominance of the orientation [110] of the centered cubic (cc) structure of Nb, and that for the curve C2 representative of the hexagonal crystallographic structure of the transition metal nitride layer NbN, there is indeed a predominance of the orientation [0004] of the hexagonal structure and of its orientation harmonic [0008], i.e. of similar orientation to [0001]. FIG. 4 shows that for the curve C3 representative of the hexagonal crystallographic structure of the transition metal layer of Hf type before nitridation, there is indeed a predominance of the orientation [0002] of the hexagonal structure, and that for the curve C4 representative of the face-centered cubic crystallographic structure of the transition metal nitride layer HfN, there is indeed a predominance of the orientation [111] of the face-centered cubic structure. On FIGS. 3 and 4, only the peaks are important for visualizing the predominance, the rest of the curve representing a continuous background due to the experimental device and the sample. Similar curves may be produced by a person skilled in the art for the other transition metals and the conclusions would be substantially identical, for example for tantalum nitride, there would be a predominance of the orientation [111] of the face-centered cubic structure of tantalum nitride.

According to a particular implementation, especially illustrated in FIG. 5, the nitridation step may comprise a first substep of nitridation En1 performed at least partly at a first temperature by imposing an injection of a nitridation gas at a first flow rate, and a second substep of nitridation En2 performed at least partly at a second temperature less than or equal to the first temperature by imposing an injection of the nitridation gas at a second flow rate different from the first flow rate. This makes it possible to optimize the crystallographic orientation of the nucleation layer. It goes without saying that these two nitridation substeps are performed one after the other. In particular, the first substep En1 makes it possible to perform a rapid nitridation and the second substep En2 makes it possible to perform annealing which stabilizes the nitride phase of the transition metal. Following these two substeps En1 and En2, the transition metal nitride layer is chemically and thermally stable and can act as protection for the substrate (in particular if this substrate is made of silicon) during the growth of the nanowire(s).

The injected gas may be ammonia $NH_3$ or dinitrogen $N_2$. $NH_3$ is preferred since it makes it possible to nitride the transition metal layer more rapidly. In point of fact, in the $NH_3$ form, the nitriding power is greater than for $N_2$. This rapid nitridation may be important especially if the transition metal is capable of being transformed into silicide: this point is addressed hereinbelow.

According to a particular example, the injected nitridation gas being ammonia, the first temperature is between 1000° C. and 1050° C., especially equal to 1050° C., the first flow rate is between 500 sccm and 2500 sccm (sccm means "standard cubic centimeters per minute"), especially equal to 1600 sccm, the second temperature is between 950° C. and 1050° C., especially equal to 1000° C. the second flow rate is between 500 sccm and 2500 sccm, especially equal to 500 sccm.

The flow rates mentioned above correspond to the volume capacity of the nitridation chamber used, i.e. a total volume of gas (for example $N_2+NH_3$) of 8 liters in the example mentioned. For a chamber of a different volume, the flow rates must be adapted (for example: for an 18-liter chamber, the first flow rate will especially have to be equal to 4000 sccm and the second flow rate especially equal to 1200 sccm). In other words, the first flow rate is between 500*V/8 sccm and 2500*V/8 sccm, especially equal to 1600*V/8 sccm, and the second flow rate is between 500*V/8 sccm and 2500*V/8 sccm, especially equal to 500*V/8 sccm. V is the total capacity in liters of a corresponding nitridation chamber. The term "corresponding nitridation chamber"

means herein the chamber in which the nitridation of the transition metal layer is performed.

In general, the nitridation step may be performed in a nitridation chamber placed at a pressure of between 50 mbar and 800 mbar, especially 100 mbar.

FIG. 5 illustrates in a detailed manner the nitridation step by representing the change in temperature as a function of the time in a nitridation chamber. In a first time T1, the temperature in the nitridation chamber rises gradually, for example at 2° C./s up to a 1050° C. stage. The first nitridation substep under $NH_3$ En1 targeted above begins when the temperature reaches 200° C. During this first substep, the $NH_3$ flow rate remains constant at 1600 sccm. In a second time T2, concomitant with at least part of the first substep, the temperature is maintained at 1050° C. for a time of between 5 minutes and 15 minutes. In a third time T3, the first substep En1 is continued while the temperature passes from 1050° C. to 1000° C. in 60 s. In a fourth time T4, the temperature in the nitridation chamber is maintained at 1000° C. for a time of between 5 minutes and 15 minutes and the second substep En2 is started. In a fifth time T5, the introduction of heat into the nitridation chamber is stopped so that the temperature of the nitridation chamber falls until it returns to room temperature. The duration of T5 may correspond to the inertia of the nitridation chamber. The second nitridation substep En2 may be continued for a given time during the fifth time T5. The fifth time T5 may correspond to stoppage of the heating of the chamber and then to its decrease in temperature or may also correspond to a step of growth of the nanowires if the chamber used for the nitridation is also the MOCVD chamber dedicated to the synthesis of the nanowires.

According to a particular implementation, the step of growth of the nanowire 3 is performed after the second nitridation substep En2, or is initiated during the second nitridation substep En2.

In general, the step of growth of said at least one nanowire 3 may comprise a step of injecting a material intended at least partly to form the nanowire 3. In particular, this will be an injection of Ga so as to form the gallium nitride nanowire 3, said nanowire 3 extending from the growth surface of the nucleation layer 2. To form the gallium nitride nanowire, the injection of Ga may be performed concomitantly with an injection of $NH_3$ or $N_2$. In general, for the synthesis of GaN, it is the reaction of Ga with $NH_3$ and not with $N_2$ that is used. The injection of Ga may be performed in a chamber adapted to the growth of nanowires.

The use of gallium nitride to form said at least one nanowire 3 provides at least two advantages.

A first advantage is that the face-centered cubic or hexagonal structures of the transition metal nitride layer (and thus of the nucleation layer 2) are favorable to epitaxy of gallium nitride. Nanowires made of gallium nitride, the crystallographic structure of which is a hexagonal structure of the wurtzite type oriented along the axis C (or along the axis [0001]) of FIG. 2, may be readily nucleated from the nucleation layer 2 as described. Alternatively, the nanowires may also be made of ZnO, InN or SiC.

A second advantage is that gallium nitride is a good candidate with a view of forming an electrooptic device. Specifically, such a nanowire 2 made of gallium nitride makes it possible to form a light nanoemitter. GaN-based quantum wells may be added either in shell form around the nanowire, or in the continuity of the axis of the nanowire (axial structure). Depending on the composition of these GaN-based quantum wells, the spectral domain of the light emission may cover a wide wavelength range extending from ultraviolet to infrared.

In order to achieve optimized nanowire growth, it is preferable for the transition metal layer to be sparingly silicide-treated. Silicidation of the transition metal layer may arise, if the substrate 1 is based on silicon, according to two cases: during the step of deposition of the transition metal, and/or when it is desired to nitride the deposited transition metal layer to delimit the nucleation layer 2.

The first case may be explained in the following manner. In point of fact, at high temperature (about 1000° C.), the formation of silicide compounds $MSi_2$ is promoted (M being the transition metal used). Among these silicides, only silicides of transition metals from column V ($VSi_2$, $NbSi_2$, $TaSi_2$), plus chromium silicide ($CrSi_2$) form crystallographic phases of hexagonal structure, which are potentially advantageous (if textured along the axis c) for the growth of GaN nanowires. However, the disagreement in lattice parameter "a" between these hexagonal phases and GaN (3.19 Å) is so large, respectively −30%, −36%, −33% and −25% for $VSi_2$, $NbSi_2$, $TaSi_2$ and $CrSi_2$, that epitaxy of GaN is highly improbable. Typically, the lattice parameter "a" for the hexagonal compounds $VSi_2$, $NbSi_2$, $TaSi_2$ and $CrSi_2$ is, respectively: 4.57 Å, 4.97 Å, 4.78 Å and 4.28 Å. Thus, a subfamily may be formed from the following materials: Ti, V, Cr, Nb, Ta, Mo, i.e. metals for which the interdiffusion coefficient with Si is high, which implies rapid growth kinetics of the new $MSi_2$ phase. By way of example, Cr has a coefficient of interdiffusion with Si at 850° C. of 1.5×10-7 $cm^2$/s, i.e. a diffusion length of about 11.6 μm in 15 minutes, whereas at about 100° C., this diffusion length falls to about 80 nm in 15 minutes. For the reasons mentioned above, if the deposited transition metal is chosen from Cr, V and Ti, it is preferentially deposited at a temperature below 100° C. so as to limit the diffusion of the silicon derived from the substrate. For Nb, the Nb—Si interdiffusion length over 15 minutes is 12 nm and 2 nm, for 800° C. and 700° C., respectively. Nb may thus be deposited at high temperature up to 700-750° C. without—or with very little—silicidation. The other materials: Zr, Hf and Ta having smaller coefficients of interdiffusion with Si than Nb, may thus be readily deposited from room temperature up to 750° C.-800° C. at most. Excessive silicidation would have the consequence of not making it possible later to obtain a transition metal nitride layer of sufficient thickness. In other words, to generalize, when the substrate is silicon, the step of deposition of the transition metal layer is configured such that the interdiffusion of silicon into the deposited transition metal layer is less than 10 nm and/or so as to conserve a non-silicide-treated (non-silicided) slice of the transition metal layer of at least 2 nm. In point of fact, this non-silicide-treated slice is opposite the substrate and is intended to form the nitride layer of the transition metal. In FIG. 6, reference 4 indicates the transition metal layer initially deposited on the substrate 1, during the deposition of the layer 4, a slice 5 of this layer may be silicide-treated such that only part 6 of the layer 4 is composed of the pure transition metal that can serve to form, by nitridation, the nucleation layer.

In the second case, the nitridation step may make it necessary to work at 1050° C. for a few minutes. To do this, use will preferably be made as nitriding gas of $NH_3$, since, by virtue of its high nitriding power, the nitridation reaction rate is higher than the silicidation reaction rate. In point of fact, in the ideal case, it is sought to form (FIG. 7) during the nitridation step at least one transition metal nitride layer 2 (i.e. the nucleation layer) in the deposited transition metal layer 4, the thickness of said transition metal nitride layer advantageously being between 2 nm and 50 nm. In order to avoid the production of a large amount of a new silicide compound in the region of this transition metal nitride layer, the nitridation step will be optimized. In point of fact, after the nitridation step, it is understood, as illustrated in FIG. 7, that the layer 4 that it was sought to produce by depositing a transition metal may actually comprise a first transition metal silicide layer 5 obtained during the deposition of said transition metal, a second transition metal silicide layer 7 placed in the continuity of the first transition metal silicide layer 5 obtained during the nitridation step and the nucleation layer 2 derived from the nitridation of the layer 6 of FIG. 6. Optionally, it is also possible that a residual layer 8 of pure transition metal remains intercalated between layer 2 and layer 7, this depending partly on the initially deposited thickness of the transition metal layer.

It results from the explanation of the first and second cases that if the substrate 1 is made of silicon, a person skilled in the art will be capable of determining the thickness of the transition metal layer which is sought to be deposited as a function of the type of transition metal to be deposited, of the temperature of deposition of the transition metal, of the duration of the transition metal deposition, and also of the duration of the nitridation step so that it is possible to obtain a layer of transition metal nitride of a predetermined thickness. In other words, for a substrate based on silicon, the step of deposition of the transition metal layer 4 may comprise a preliminary step of determining the thickness of the transition metal layer 4 to be deposited, said step of determining the thickness comprising: a step of determining a first diffusion length of silicon into the transition metal layer 4 during the future deposition of the transition metal layer 4 as a function of the transition metal used and of the deposition temperature; a step of determining a second diffusion length of silicon into the transition metal layer 4 during the future step of nitridation of the transition metal layer 4. Said thickness of the transition metal layer 4 to be deposited being a function of the desired thickness of the transition metal nitride layer and of a thickness of a slice of transition metal silicide obtained in the future transition metal layer 4 from the first and second determined diffusion lengths.

In general, the substrate 1 will advantageously be prepared before the deposition of the transition metal layer 4. To do this, the process may comprise, before the step of deposition of the transition metal layer, a step of deoxidation of a surface of the substrate 1 intended to receive the deposit of the transition metal layer 4. More particularly, this step of deoxidation of the surface of the silicon may be performed either chemically (HF bath) or physically (etching of the surface by applying a bias tension to the substrate 1). This makes it possible especially to remove the layer of native silicon oxide ($SiO_2$) which is an "insulating" barrier to the injection of electrons into the nucleation layer and into the gallium nitride nanowire.

Preferentially, the growth process described above may be used in the context of forming an optoelectronic device.

Thus, the invention may also relate to a process for manufacturing an optoelectronic device (FIG. 8). Such a manufacturing process comprises a step of implementing the growth process as has been described above, especially in its various implementations or embodiments. Moreover, the manufacturing process also comprises a step of electrical doping of a first type of at least one end 3a of the nanowire 3 opposite the substrate 1. This first type is, preferably, doping of n type. In addition, the process also comprises a step of forming an electrically doped element 9 of a second type opposite the first type at the end 3a of the nanowire 3 opposite the substrate 1. This second type of doping is preferentially of p type. Thus, the end 3a of the nanowire 3 and the doped element 9 associated with this end 3a may form a junction of a diode intended to emit light. This junction is preferably a homojunction, i.e. the nanowire 3 and the associated doped element 9 are based on the same materials, for instance gallium nitride. The preparation of a heterojunction is also possible: for example, it is possible to use ZnO in the form of an n-doped nanowire, and then to add quantum wells based on ZnO and to use the element 9 made of electrically p-doped GaN. In point of fact, it is currently difficult to p-dope ZnO.

FIG. 8 illustrates a particular example of the optoelectronic device obtained from the manufacturing process. It thus features the substrate 1, preferably made of silicon and configured so as to be electrically conductive (for example n-doped), one face of the substrate 1 is oriented toward the nucleation layer 2. From this nucleation layer 2 extends the nanowire 3. The term "extends" means that the nanowire 3 has a length defined between two longitudinal ends 3a, 3b, a first longitudinal end 3b being in contact with the nucleation layer 2 and a second longitudinal end 3a being distant from the nucleation layer 2. The element 9 doped so as to form a junction with the second end 3a of the nanowire 3 may at least partly cover the nanowire 3 at said second end 3a. Preferably, the doped element 9 forms a sheath around the end 3a of the nanowire 3.

Moreover, in the context of an optoelectronic device, it may be advantageous to add quantum wells intended to form confinement zones so as to increase the emission yield of the nanowire 3. Thus, the process for manufacturing the optoelectronic device may comprise a step of forming quantum wells placed at the interface between the nanowire 3 and the electrically doped element 9 of the second type. The quantum wells may be deposited in the form of a shell around the nanowire. The composition of the material constituting the quantum wells is adjusted so that the emission of light takes place at the chosen wavelength. The quantum wells are formed in an additional layer sandwiched between the nanowire and the element 9.

Preferably, nanowires associated with the same nucleation surface are simultaneously polarized by the nitride layer forming the nucleation layer 2. By using a sparingly resistive silicon substrate 1, the electrical resistances of the various transition metals and of their nitrides are correct and in agreement with the literature. An advantage of using the transition metal nitrides described hitherto is effectively that they allow the nucleation and then growth of GaN nanowires, but another important advantage of these materials is that they do not introduce any potential barrier on the passage of the current (unlike AlN, for example).

The invention also relates to any device obtained via one or other of the processes described above, preferably to any device in which the nucleation layer does not contain titanium.

Preferably, the predominant crystallographic structure of the substrate is of orientation [100] at least at the interface between the substrate and the transition metal layer. This especially makes it possible to reduce the manufacturing costs.

The invention claimed is:

1. A process for growing at least one semiconductor nanowire, said growing process comprising a step of forming, on a substrate, a nucleation layer for the growth of the nanowire and a step of growth of the nanowire, wherein the step of forming the nucleation layer comprises the following steps:
deposition onto the substrate of a layer of a transition metal chosen from Ti, V, Cr, Zr, Nb, Mo, Hf, Ta,
nitridation of at least part of the transition metal layer so as to form a transition metal nitride layer having a surface for the growth of the nanowire, the nitridation step being at two differing temperatures.

2. The process as claimed in claim 1, wherein the step of nitridation of said transition metal layer is performed so as to at least partly modify the crystallographic structure of the transition metal layer toward a face-centered cubic crystallographic structure, which is especially oriented [111], or hexagonal, which is especially oriented [0001] or along the direction of the axis "C", associated with the transition metal nitride layer.

3. The process as claimed in claim 1,
wherein the nitridation step comprises:
a first nitridation substep at least partly performed at a first temperature by imposing an injection of a nitridation gas at a first flow rate,
a second nitridation substep at least partly performed at a second temperature less than or equal to the first temperature by imposing an injection of the nitridation gas at a second flow rate different from the first flow rate.

4. The process as claimed in claim 3, wherein the injected nitridation gas is ammonia, and wherein:
the first temperature is between 1000° C. and 1050° C.,
the first flow rate is between 500*V/8 sccm and 2500*V/8 sccm,
the second temperature is between 950° C. and 1050° C.,
the second flow rate is between 500*V/8 sccm and 2500*V/8 sccm,
in which V is the total capacity in liters of a corresponding nitridation chamber.

5. The process as claimed in claim 3, wherein the nitridation step is performed in a nitridation chamber placed at a pressure of between 50 mbar and 800 mbar.

6. The process as claimed in claim 3, wherein the step of growth of the nanowire is performed after the second nitridation substep, or is initiated during the second nitridation substep.

7. The process as claimed in claim 1, wherein the step of growth of the nanowire comprises a step of injection of Ga to form a gallium nitride nanowire, said nanowire extending from the growth surface of the nucleation layer.

8. The process as claimed in claim 1,
wherein, the substrate is silicon, the step of depositing the transition metal layer is configured such that the interdiffusion of silicon into the deposited transition metal layer is less than 10 nm and/or so as to conserve a non-silicided slice of the transition metal layer of at least 2 nm.

9. The process as claimed in claim 1, wherein, with the deposited transition metal being chosen from Cr, V and Ti, said transition metal is deposited at a temperature below 100° C.

10. The process as claimed in claim 1,
wherein, the substrate is silicon, the step of depositing the transition metal layer comprises a preliminary step of determining the thickness of the transition metal layer to be deposited, comprising:
determining a first diffusion length of silicon into the transition metal layer during the future deposition of the transition metal layer as a function of the transition metal used and of the deposition temperature,
determining a second diffusion length of silicon into the transition metal layer during the future step of nitridation of the transition metal layer,
said thickness of the transition metal layer to be deposited being dependent on the desired thickness of the transition metal nitride layer and on a thickness of a slice of transition metal silicide obtained in the future transition metal layer from the first and second determined diffusion lengths.

11. The process as claimed in claim 1, wherein it comprises a step in which the substrate is envisioned such that it has a resistivity of between 1 mΩ·cm and 100 mΩ·cm.

12. The process as claimed in claim 1, wherein it comprises, before deposition of the transition metal layer, a step of deoxidation of a surface of the substrate intended to receive the transition metal layer.

13. A process for manufacturing an optoelectronic device, which comprises:
a step of performing the growth process as claimed in claim 1,
electrical doping of a first type of at least one end of the nanowire opposite the substrate,
the formation of an electrically doped element of a second type opposite the first type at the end of the nanowire opposite the substrate.

14. The process as claimed in claim 13, wherein it comprises a step of forming quantum wells placed at the interface between the nanowire and the electrically doped element of the second type.

15. A process for growing at least one semiconductor nanowire, said growing process comprising a step of forming, on a substrate, a nucleation layer for the growth of the nanowire and a step of growth of the nanowire, wherein the step of forming the nucleation layer comprises the following steps:
deposition onto the substrate of a layer of a transition metal chosen from Ti, V, Cr, Zr, Nb, Mo, Hf, Ta,
nitridation of at least part of the transition metal layer so as to form a transition metal nitride layer having a surface for the growth of the nanowire,
wherein the nitridation step comprises:
a first nitridation substep at least partly performed at a first temperature by imposing an injection of a nitridation gas at a first flow rate,
a second nitridation substep at least partly performed at a second temperature less than or equal to the first temperature by imposing an injection of the nitridation gas at a second flow rate different from the first flow rate.

16. The process as claimed in claim 15, wherein the injected nitridation gas is ammonia, and wherein:
the first temperature is between 1000° C. and 1050° C.,
the first flow rate is between 500*V/8 sccm and 2500*V/8 sccm,
the second temperature is between 950° C. and 1050° C.,
the second flow rate is between 500*V/8 sccm and 2500*V/8 sccm,
in which V is the total capacity in liters of a corresponding nitridation chamber.

17. The process as claimed in claim 15, wherein the nitridation step is performed in a nitridation chamber placed at a pressure of between 50 mbar and 800 mbar.

18. The process as claimed in claim 15, wherein the step of growth of the nanowire is performed after the second nitridation substep, or is initiated during the second nitridation substep.

19. A process for growing at least one semiconductor nanowire, said growing process comprising a step of forming, on a substrate, a nucleation layer for the growth of the nanowire and a step of growth of the nanowire, wherein the step of forming the nucleation layer comprises the following steps:
- deposition onto the substrate of a layer of a transition metal chosen from Ti, V, Cr, Zr, Nb, Mo, Hf, Ta,
- nitridation of at least part of the transition metal layer so as to form a transition metal nitride layer having a surface for the growth of the nanowire,
- wherein, the substrate is silicon, the step of depositing the transition metal layer is configured so that at least one of (i) the interdiffusion of silicon into the deposited transition metal layer is less than 10 nm and (ii) a non-silicided slice of the transition metal layer of at least 2 nm is conserved.

20. A process for growing at least one semiconductor nanowire, said growing process comprising a step of forming, on a substrate, a nucleation layer for the growth of the nanowire and a step of growth of the nanowire, wherein the step of forming the nucleation layer comprises the following steps:
- deposition onto the substrate of a layer of a transition metal chosen from Ti, V, Cr, Zr, Nb, Mo, Hf, Ta,
- nitridation of at least part of the transition metal layer so as to form a transition metal nitride layer having a surface for the growth of the nanowire,
- wherein, the substrate is silicon, the step of depositing the transition metal layer comprises a preliminary step of determining the thickness of the transition metal layer to be deposited, comprising:
- determining a first diffusion length of silicon into the transition metal layer during the future deposition of the transition metal layer as a function of the transition metal used and of the deposition temperature,
- determining a second diffusion length of silicon into the transition metal layer during the future step of nitridation of the transition metal layer,
- said thickness of the transition metal layer to be deposited being dependent on the desired thickness of the transition metal nitride layer and on a thickness of a slice of transition metal silicide obtained in the future transition metal layer from the first and second determined diffusion lengths.

* * * * *